United States Patent [19]

Philippot et al.

[11] Patent Number: 4,990,217

[45] Date of Patent: Feb. 5, 1991

[54] PROCESS FOR THE PREPARATION OF BERLINITE CRYSTALS WITH HIGH Q FACTOR

[75] Inventors: Etienne Philippot, Saint Mathieu de Treviers; Jean-Claude Jumas, Castelnau le Nez; Bernard Capelle, Villejuif; Yves Toudic, Lannion; Jacques Detaint, Villemonble; Jacquie Schwartzel, Palaiseau; Aline Goiffon, Saint Clement la Riviiere; Maurice Maurin, Montpellier; Jean-Claude Doukhan, Villeneuve; Albert Zarka, Paris, all of France

[73] Assignees: Centre National de al Recherche Scientifique (CNRS); Etat Francais, représenté par le Ministre des PTT (Centre National d'Etudes des Télécommunications), both of Paris, France

[21] Appl. No.: 303,001

[22] Filed: Jan. 26, 1989

Related U.S. Application Data

[63] Continuation-in-part of Ser. No. 240,148, Sep. 2, 1988, abandoned, which is a continuation-in-part of Ser. No. 21,182, Mar. 3, 1987, abandoned.

[30] Foreign Application Priority Data

Mar. 4, 1986 [FR] France .................................. 86 03009

[51] Int. Cl.$^5$ ..................... C30B 29/14; C30B 7/10; C01B 15/16
[52] U.S. Cl. .................................. 156/623 R; 156/621; 156/DIG. 61; 423/311
[58] Field of Search ........... 156/621, 623 R, DIG. 61; 423/305, 311; 252/62.9

[56] References Cited

U.S. PATENT DOCUMENTS

| | | | |
|---|---|---|---|
| 4,247,358 | 1/1981 | AuCoin et al. | 156/623 R |
| 4,300,979 | 11/1981 | Kolb et al. | 156/623 R |
| 4,324,773 | 4/1982 | Chai et al. | 423/311 |
| 4,382,840 | 5/1983 | Chai et al. | 156/623 R |
| 4,481,069 | 11/1984 | Chai et al. | 156/623 R |
| 4,578,146 | 3/1986 | Chai et al. | 156/623 R |
| 4,579,622 | 4/1986 | Caporaso et al. | 156/623 R |
| 4,678,535 | 7/1987 | Mang | 156/623 R |

FOREIGN PATENT DOCUMENTS 2559165 4/1985 France .
2595344 9/1987 France .

OTHER PUBLICATIONS

*Ameliorationn de la qualite cristalline de la berlinite: solubilite et croissance en milieu sulfurique* Aline Goiffon, Jean–Claude Jumas, Christian Avinens et Etienne Philippot, pp. 593–604, Revue de Chimie Materials t.24, 1987, #6.

Primary Examiner—Gary P. Straub

[57] ABSTRACT

The invention relates to a process for the preparation of berlinite crystals AlPO$_4$, with a high Q factor, from seeds or crystalline flakes of AlPO$_4$, by a hydrothermal method. It is characterized in that the crystallization solution is a sulfuric solution of AlPO$_4$. The invention also relates to the berlinite monocrystals obtained by this process.

9 Claims, 9 Drawing Sheets

Comparison of solubilities of AlPO$_4$ in H$_3$PO$_4$, HCl and H$_2$SO$_4$ of neighboring concentration as a function of the temperature (S in mole/l).

Solubility S(in mole/l) of AlPO$_4$ in H$_2$SO$_4$, as a function of the temperature (P<20 bars).
(a) H$_2$SO$_4$ 5.0M
(b) H$_2$SO$_4$ 7.5M
(c) H$_2$SO$_4$ 9.0M

FIG. 5

Comparison of solubilities of $AlPO_4$ in $H_3PO_4$, HCl and $H_2SO_4$ of neighboring concentration as a function of the temperature (S in mole/l).

Concentration of "water" in the crystals as a function of $T_c$, of the speed of growth and of the concentration. values obtained from 2 crystals of 4.5 and 7.5mm thickness.

FIG. 9

Growth speeds on x and z seeds as a function of growth temperatures for a $\Delta T = 5°C$ and in an $H_2SO_4$ 6M medium.

PROCESS FOR THE PREPARATION OF BERLINITE CRYSTALS WITH HIGH Q FACTOR

CROSS REFERENCE TO RELATED APPLICATION

This application is a continuation-in-part of previously filed application Ser. No. 240,148, filed Sept. 2, 1988, which is now abandoned. Parent application Ser. No. 240,148 is itself a continuation-in-part application of grandparent application Ser. No. 021,182, filed Mar. 3, 1987, now abandoned.

The present invention relates to a process for the growth of berlinite crystals with a high Q-factor.

The density of communications traffic and the level of frequencies used are such that it has become indispensable, in establishing a connection, to use filter devices (volume or surface wave systems). The basic component of these devices is a resonator whose quality depends on the piezoelectric material necessary for its production.

To construct a volume or surface wave resonator, large size crystals must be available (several cm$^3$) possessing the best possible piezoelectric and mechanical qualities. Three crystals are used: quartz, berlinite (AlPO$_4$) and lithium tantalate (LiTaO$_3$). Berlinite is intermediate between the two other materials, both from the point of view of band pass and electromechanical coupling factor. In addition, its frequency derivative as a function of temperature is reduced according to known cases by a factor varying around from 1.5 to 2.

However, the industrial use of berlinite remains limited by Q-factors which are still low: some thousands in comparison with the 10$^6$ of quartz.

The method used for the growth of berlinite is the hydrothermal method. In a phosphoric medium the solubility of berlinite is retrograde; consequently, two processes may be brought into play:

1. The so-called inverse gradient method:

An autoclave is used comprising two zones: a cold zone in which the mother body is placed and a hot zone in which the seeds are placed. The temperature gradient can be vertical (autoclave in the vertical position); in this case the transport of material from the mother body towards the seeds through the solvent is effected by convection currents. The temperature gradient may be horizontal (autoclave in the horizontal position); in this case, the transport of material is effected by diffusion; to this may also be added a vertical gradient.

2. The so-called Slow Rise in temperature method (MLT):

Growth commences at a so-called crystallization initiation temperature where the solution is presaturated. It continues by regular increase of the temperature: the solution then becomes supersaturated and the material is deposited on seeds or in the absence of the latter on the walls of the autoclave.

The two processes may be used conjointly.

From the solubility curves of berlinite in the solvents concerned (H$_3$PO$_4$, HCl) it is possible to cause AlPO$_4$ to grow between 135° C. and about 400° C. However, the range used is comprised between 150° C. and 210° C. in the case of growth on seeds.

Nonetheless, at present these processes do not permit berlinite crystals to be obtained with Q-factors which permit their industrial application.

The present invention relates to new berlinite crystals with a high Q-factor, more precisely, with a Q-factor from about 10$^4$ to about 10$^6$ even as high as 10$^7$. These valves are not precise but correspond rather to an order of magnitude.

The present invention relates to a process for the preparation of berlinite crystals (AlPO$_4$), by a high Q factor from seeds or from crystalline flakes of AlPO$_4$, by a hydrothermal method, characterized in that the crystallization solution is a sulfuric solution of AlPO$_4$.

It must be well understood that the hydrothermal method employed may be any one of the previously described methods, namely horizontal gradient (GHT), vertical gradient (GVT) or MLT.

Except for indication to the contrary, the conditions of employing these methods will be considered as known to the technician skilled in the art or can be determined by known methods.

The use of a sulfuric solution along or of a solution constituted by a sulfuric acid/phosphoric acid mixture enables berlinite crystals to be obtained with high Q factors.

In addition, the use of sulfuric solution enables the crystalization solution to be prepared containing the mother-body directly by the reaction of hydrated aluminum sulfate on H$_3$PO$_4$, if necessary in the presence of H$_2$SO$_4$, the proportions of reagents being calculated to obtain a crystalization solution having the desired proportions according to the reaction:

$$Al_2(SO_4)_3, xH_2O + 2H_3PO_4 \rightarrow 2AlPO_4 + 3H_2SO_4 + xH_2O$$

The reaction can be carried out, preferably, directly in the crystalization autoclave.

By effecting rapid crystalization cycles on the AlPO$_4$ solutions thus obtained, berlinite crystals of small size are obtained which could constitute the mother-body.

This method has numerous advantages:

the obtaining of berlinite of high purity, reduced cost due to the low price of the aluminum sulfate compared with that of ultra-pure alumina and with greater rapidity of reaction with respect to Al$_2$O$_3$, simultaneous preparation of berlinite and of berlinite solution in sulfuric medium which can be used for the slow rise crystallogenesis.

Of course, it is possible to prepare AlPO$_4$ for the solution by other methods, for example from alumina of high purity and phosphoric acid, AlPO$_4$ being then dissolved in sulfuric acid or the sulfuric acid/phosphoric acid mixture to constitute the solution and the mother-body.

Studies which have been conducted to determine the crystallization parameters have established the influence of the water content of the crystals on their properties. In particular, the crystals having a high content of water show also a low Q factor. In addition the inclusion of water in the crystal can have an undesirable effect on the reliability and the stability of devices constructed from the resonators.

It is hence advantageous to obtain crystals with a low water content.

An explanation of using H$_2$SO$_4$ with respect to H$_3$PO$_4$ for example, may be that its vapor tension is distinctly lower, which reduces the pressure at which crystallization takes place and might limit the inclusion of water in the crystal.

It is also advantageous, to reduce the pressure in the crystallization autoclave, to limit the filling of the latter, for example by filling it to 80-85% of its overall volume.

As shown in the solubility curve figures it is possible to use a solution of $H_2SO_4$ between about 135° C. to 350° C. However, the industrial lower limit seems to be 190° C. and the upper limit 300° C., the preferred range of temperature being from 200° C. to 260° when phosphoric acid is used and when phosphoric acid is in a concentration higher than the one of the sulfuric acid. These values may be increased by 10° C., better by 20° C. or even by 40° C.

These temperatures have, in addition, the advantage of corresponding to less solubility of water in the crystal than lower temperatures often employed in the prior art with $H_3PO_4$ solutions.

The quality of the crystal depends also on the composition of the crystallization solution. When referring to the solution composition the chemical species corresponding to the berlinite in solution is obviously disregarded.

The sulfuric acid may be used in all its existing range. That is to say from about 0.5M to the compound corresponding to $1H_2O$ for $1SO_3$. An advantageous range is the range 0.5-9M whereas the preferred one is about 1M to 6M. The concentration of phosphoric acid, if present, may be between about 0 and 6M, preferably between 0 and 3M.

The speeds of growth (v) are advantageously between 0.01 and 10 mm, preferably between 0.1 and 1 mm per day and per face. In fact, the lower the speed the better the crystal but the speed must be high enough for economical reasons. The temperature gradient delta T is advantageously between 0.1° and 20° C., preferably between 1° to 10° C.

To determine the best conditions for producing crystals according to the various requirements of the market, men skilled in the art may take into account the following teachings and data summarized hereafter and it the figure diagrams.

The other parameters of the method will be determinable as a function particularly;
of the hydrothermal technique used,
possibly, of certain parameters of the autoclave.

The present invention relates also to the berlinite crystals obtained from a sulfuric solution which will be called below "berlinite crystals obtained in sulfuric solution".

Figure 10:
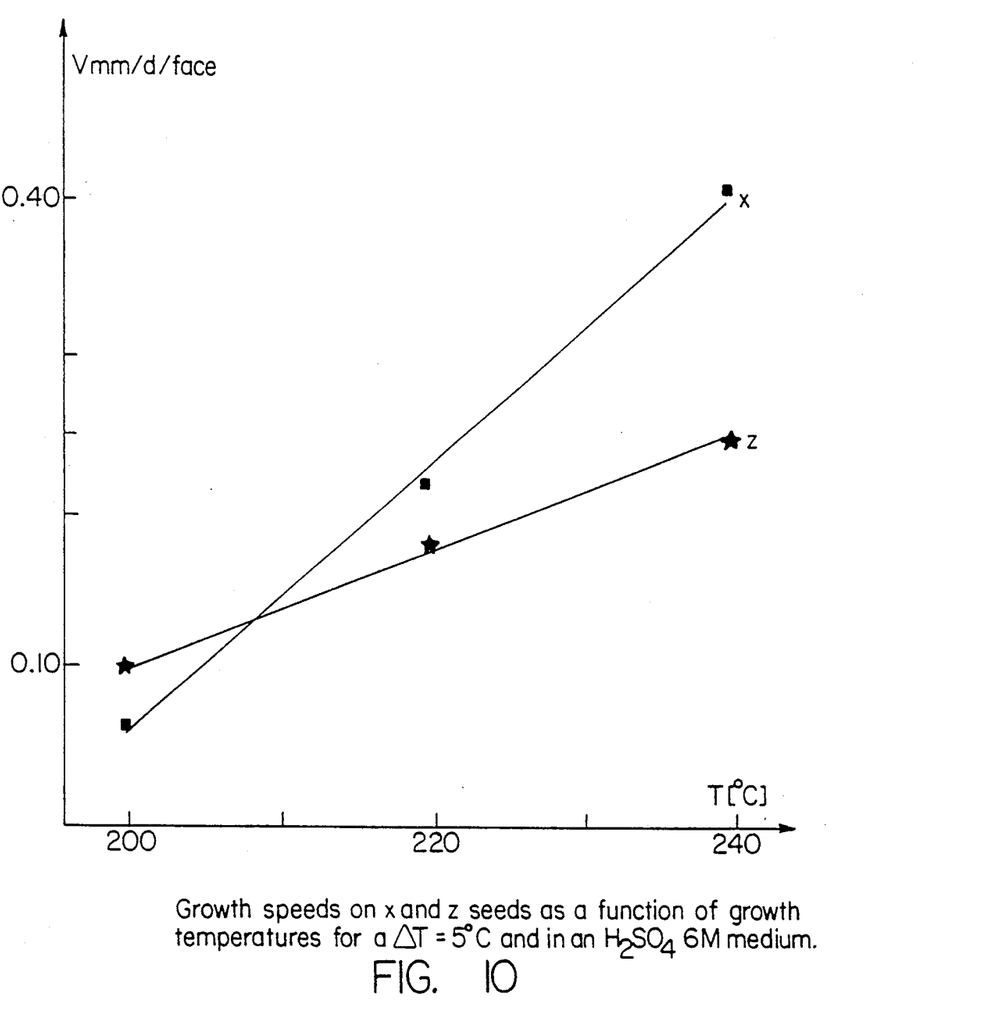
FIG. 10 shows and quantifies how the growth speed varies with the temperature and how to master the relative speed along the various axes.
Figure 11:
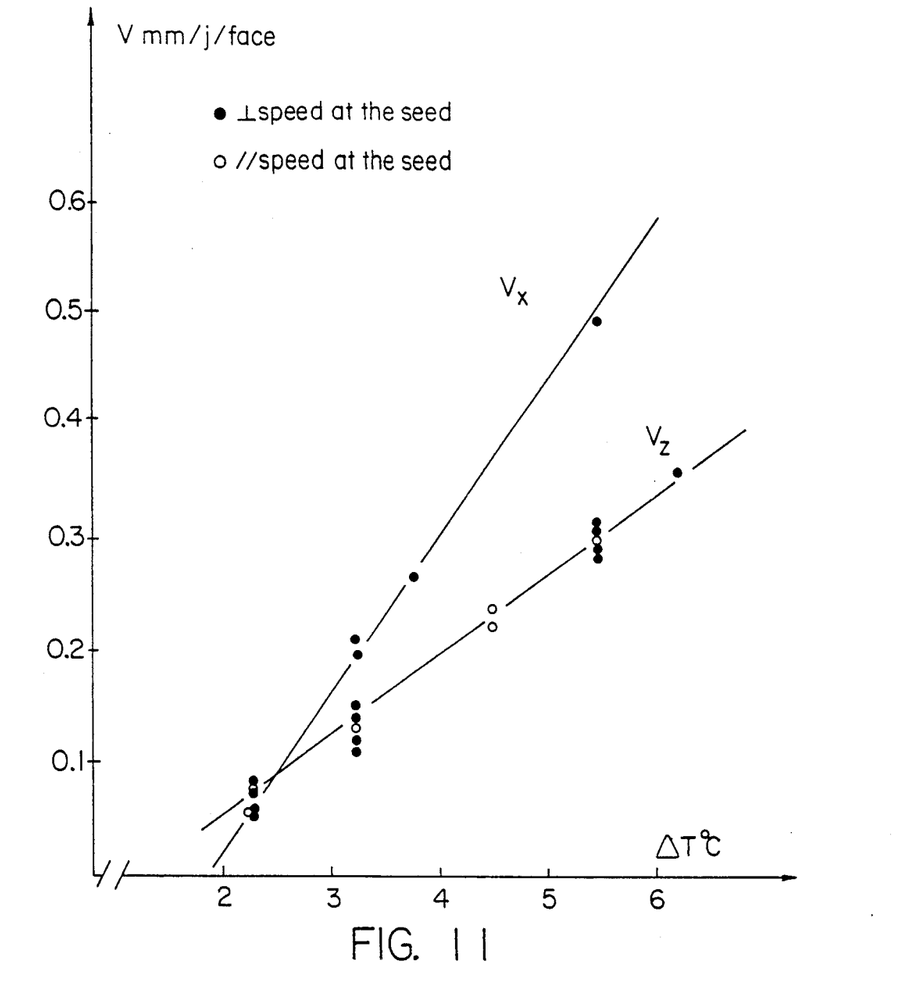
FIG. 11 quantifies the dependence of the growth speed on the temperature gradient delta T.

The berlinite crystals obtained in $H_2SO_4$ solution have a different morphology from the crystals obtained in $H_3PO_4$, namely if one starts from a seed Y (cut parallel to the natural growth surfaces m):

1. the development of the surfaces $\pi$ and $\pi'$ is much greater in the case of $H_2SO_4$, 2. the speeds of growth along X and Z are very different, which leads to crystals which are more isometric in the case of $H_2SO_4$, (the speed of growth along X is distinctly higher in the case of $H_2SO_4$ and approaches the speed of growth along Z), and under specific conditions Vx is higher than Vz as can be seen in the FIGS. 10 and 11.

The crystals according to the invention present the following feature:

low content in water, under 200 ppm (rounded figure) advantageously under 100 and preferably under 50 ppm; the best results are with a water content under 40 ppm.

a Q factor as measured in example 7 between 10 000 and 100 000; because the limiting factor is no longer in the crystal but in the measuring device, the Q factor must be calculated from a mode other than the fundamental mode if the intrinsic value is referred to, in that case the Q factor (intrinsic) of the crystal of the invention is comprised between $10^4$ and $10^7$. These values are not precise but correspond rather to an order of magnitude;

significant face area of the obtained monocrystals corresponds to the face pi(1 0 1.2) and pi'(0 1 1.2);

this factor is not easy to quantify but can be expressed by the fact that the ratio between on one hand the sum of the area of the faces pi and pi' and on the other hand the sum of the area of the faces r (1 0 1.1) and z (0 1 1.1) is at least equa to ⅓ advantageously to ½ preferably 1 or even 5. When Z seed is used at a temperature higher than 220° C. the faces r, z and even sometimes m disappeared.

Figure 1:
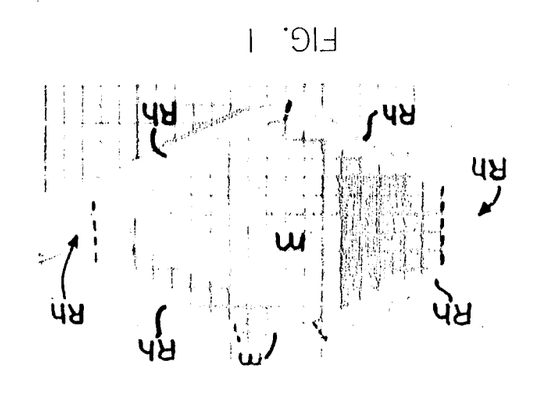
FIGS. 1 and 2 show a crystal grown in $H_3PO_4$ solution at 160°-180° C.
Figure 2:
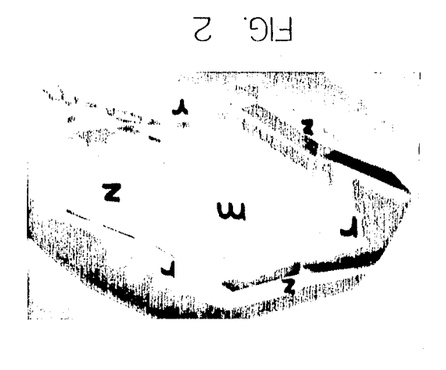
Figures 3, 4:
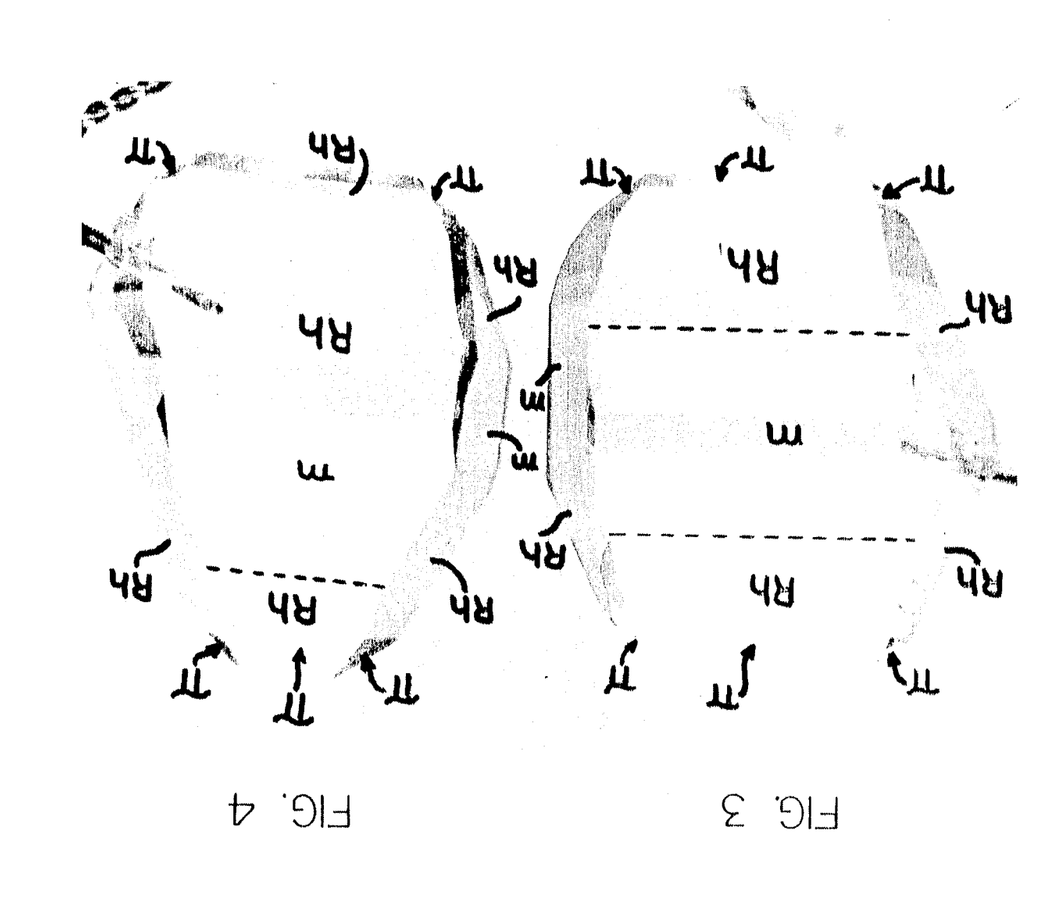
FIGS. 3 and 4 show a crystal grown from $H_2SO_4$ at 210° C.
Figure 5:
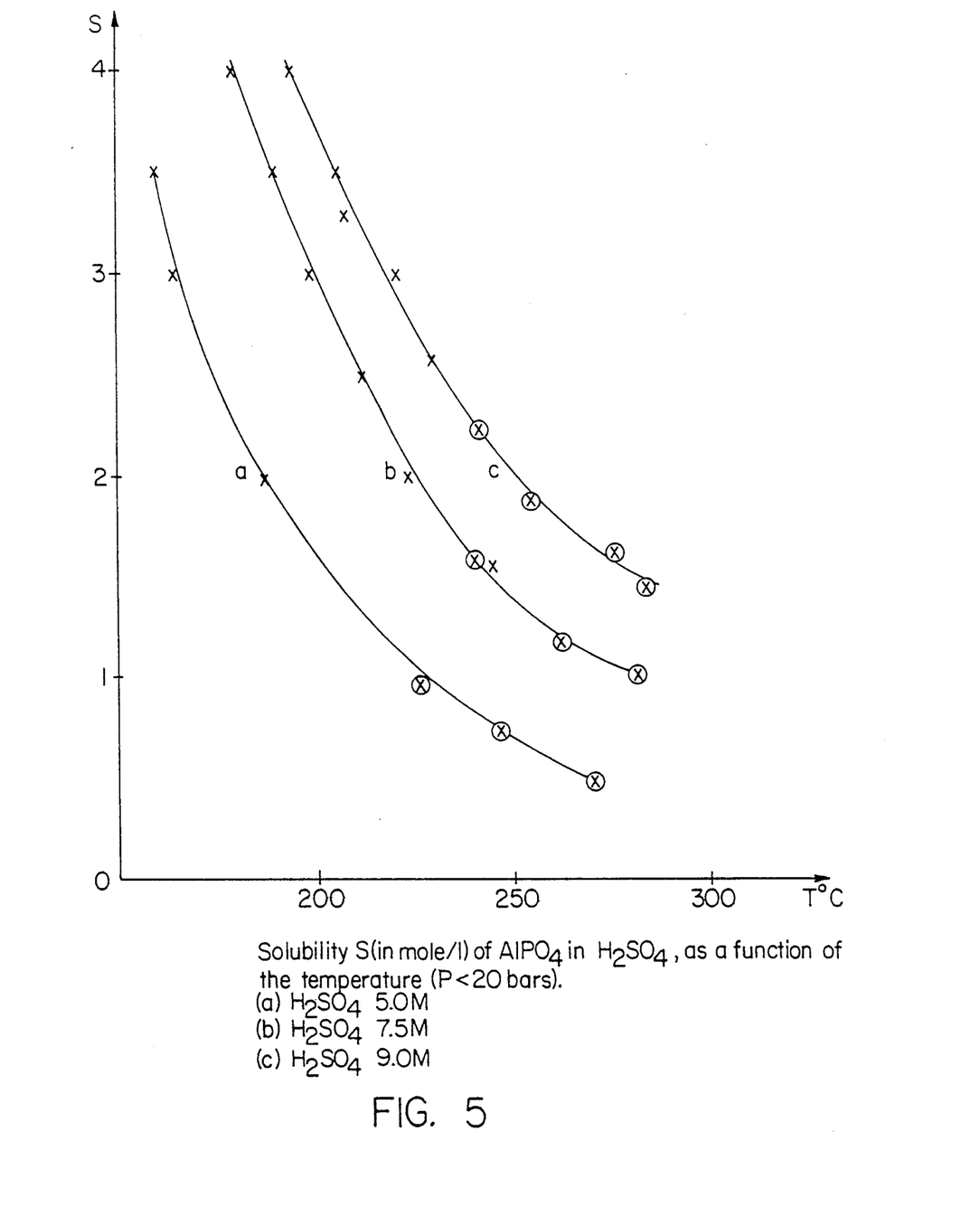
FIG. 5 represents solubility curves of $AlPO_4$ (in mol per liter) as a function of the temperature, with the curve (a) in $H_2SO_4$ 5.0M; (b) in $H_2SO_4$ 7.5M and (c) $H_2SO_4$ 9.5M.
Figure 6:
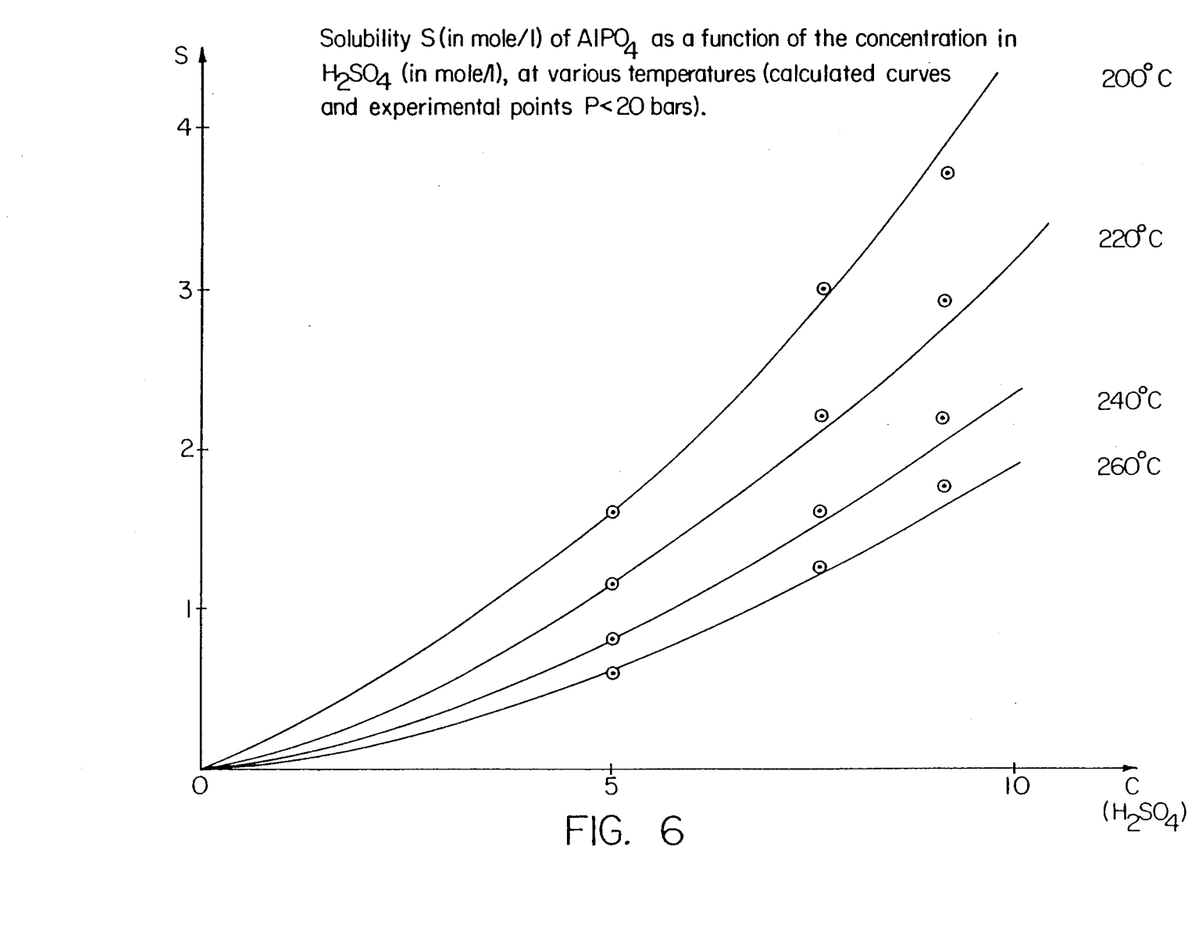
FIG. 6 represents solubility isotherms of berlinite in pure sulfuric acid as a function of concentration.
Figure 7:
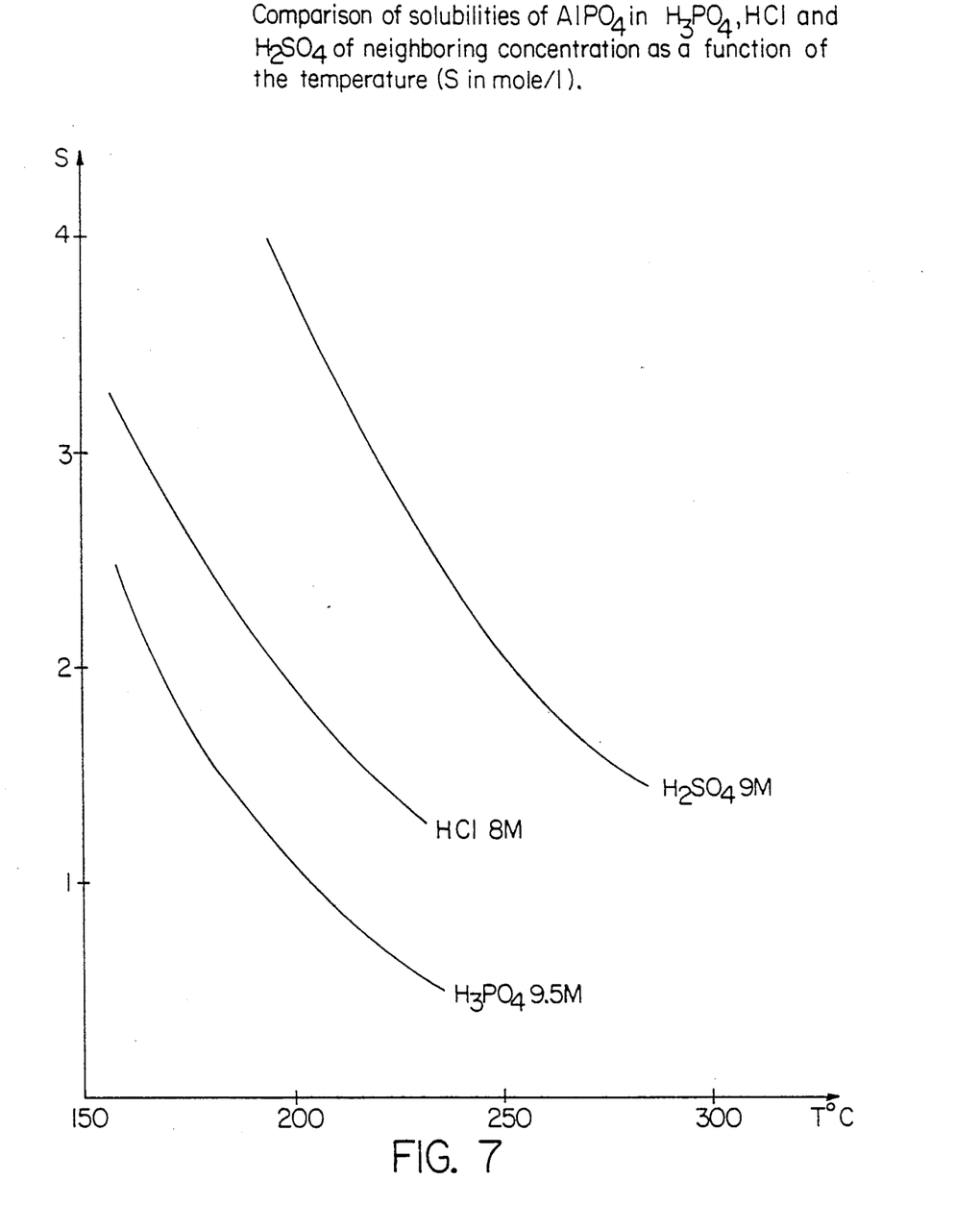
FIG. 7 is given only as a comparison of the property of sulfuric acid with hydrochloric and phosphoric acid. It may be seen that the solubility of berlinite in sulfuric acid is far higher than in the other acid.
Figure 8:
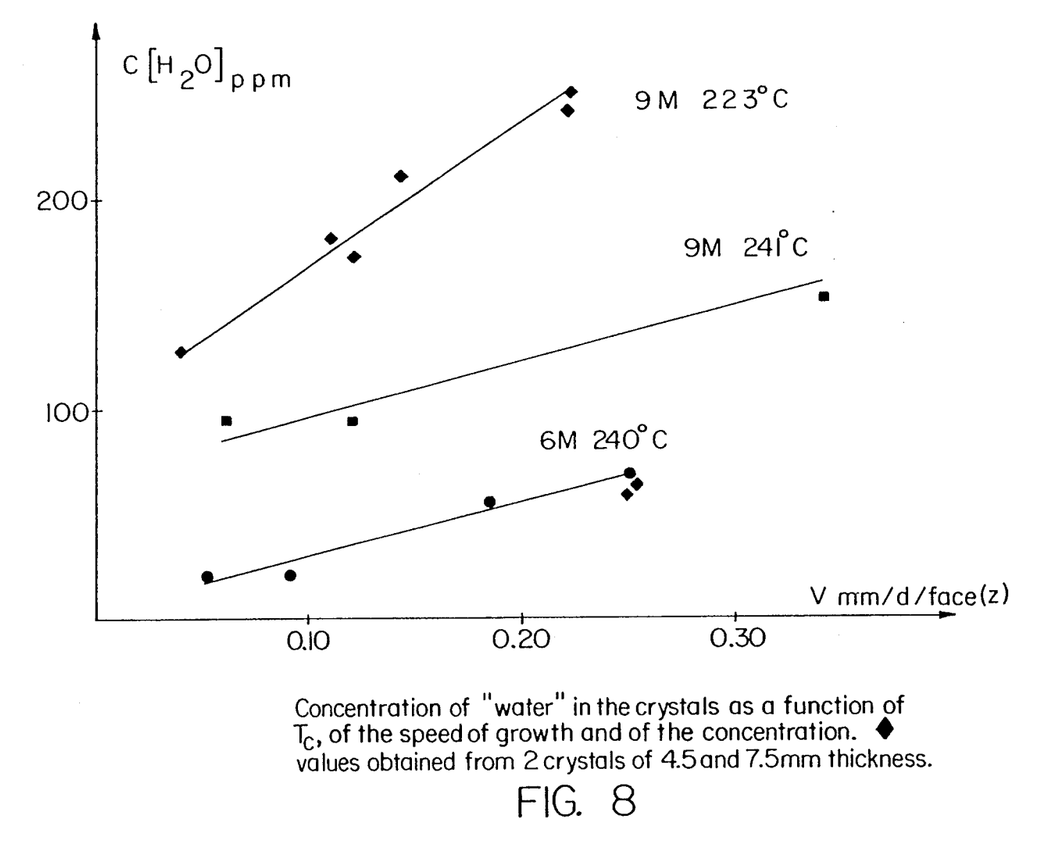
FIG. 8 corresponds to the water content in the berlinite crystals ($H_2O$ expressed in parts per million-ppm) as a function of the speed of growth (Vmm per day and per face) (the diagrams quantify this fact). From these diagrams men skilled in the art will gather that the water content increases with the speed and with the acid concentration and decreases with the temperature increase. On the same diagram, the speeds of growth of various directions are on the same curve. More precisely, the points correspond to Z seeds whereas the squares correspond to X seeds. The diagram shows clearly that the higher the temperature the lower the water content in the crystals.
Figure 9:
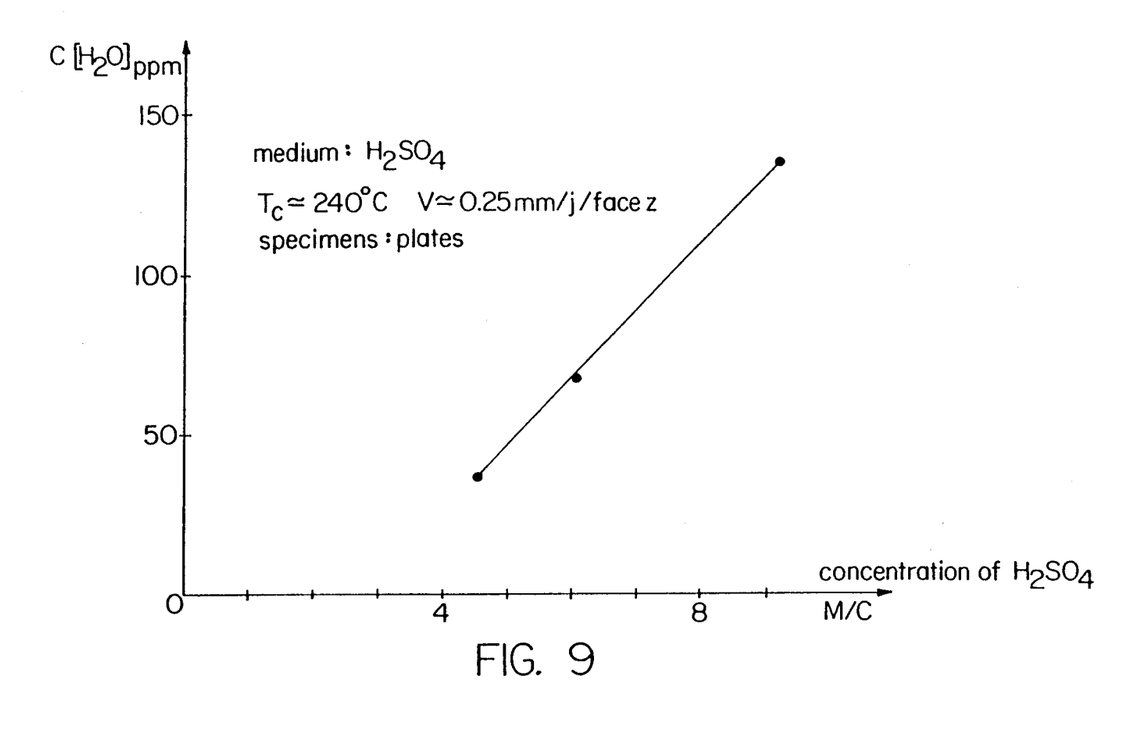
FIG. 9 shows the water content of the crystal as a function of the acid concentration. This curve shows clearly and quantifies how the water content decreases with the sulfuric concentration at growth speeds compatible with industrial exploitation of the invention (0.25 mm per day). In that case the seeds are Z seeds (point) and the water contained is given in ppm.

The attached FIGS. 1-4 are photographs of crystals obtained, on one hand, from solution in $H_3PO_4$ at 160°-180° C. (FIG. 1, in GVT and FIG. 2, in GHT) and, on the other hand, from solution in $H_2SO_4$ at 210° C. (FIGS. 3 and 4).

In these figures, $\pi = \pi$ or $\pi'$ and Rh=r or z, surface of the rhombohedron, m indicates the natural growth faces.

Crystals thus obtained from $H_2SO_4$ solution, show a very different morphology from that of crystals of the prior art, besides their improved properties.

The following examples are intended to illustrate other advantages and features of the present invention.

Due to the purifying effect of the crystallization in the sulfuric medium, the requirements regarding the purity of the reagents are the same or less stringent than those for reagents used in prior art berlinite synthesis.

The aluminum phosphate used is sold under the trademark "selectipur" by Merck in Darmstadt. The phosphoric acid and the sulfuric acid were respectively 85% and 95–97%, both for analysis. As for the aluminum sulfate, it is a plain pure aluminum sulfate such as the one sold by Merck or by Rhone-Poulenc. The preparation of aluminum phosphate from aluminum sulfate as described hereafter gives a very pure product and gives results similar to "selectipur".

EXAMPLE 1

A solution of hydrated aluminum sulfate (1188 g $AL_2(SO_4)_3$, $14H_2O$) in a mixture of $H_3PO_4 - H_2SO_4$ (166 cm$^3$ $H_2SO_4$ 18 m; 266 cm$^3$ $H_3PO_4$ 15 m) is prepared so that after reaction the solution is 4M in $AlPO_4$ and 9M in $H_2SO_4$. This solution, placed in a Teflon-jacketed autoclave filled to 80%, undergoes 15 temperature cycles 200°–270° C. at the rate of 1 cycle per day. After rapid cooling of the autoclave, berlinite crystals of dimensions comprised between 2 and 4 mm are obtained.

EXAMPLE 2

Hydrated aluminum sulfate (1039 g AL $(SO_4)_3$, $14H_2O$) is dissolved in $H_3PO_4$ (233 cm$^3$ $H_3PO_4$ 15 m) in proportions such that after reaction the solution is 3.5M in $AlPO_4$ and 5.25M in $H_2SO_4$. The solution obtained is placed in a Teflon-jacketed autoclave filled to 80%. The solution undergoes 3 temperature cycles 200°–270° C. at the rate of 1 cycle per day. After rapid cooling of the autoclave, the berlinite is obtained in powdered form.

EXAMPLE 3

In a glass vessel, sealed under vacuum, of outer diameter 30 mm and having a narrowed portion of internal diameter 10 mm, at one third of its length, is placed:

in the shortest part, the cold part, 20 g of aluminum phosphate in the form of micro-crystalline powder.

in the longest part, the hot part, 6 plates (laminae) (orientations X, Y, Z and r) of berlinite; these plates are pierced and suspended by means of gold wires to a glass jib.

The filling of the vessel is ensured to 80% by a solution $H_2SO_4/AlPO_4$ respectively 5M and 2M. The vessel is brought as rapidly as possible to the desired equilibrium temperatures: cold part $T_1 = 190°$ C., hot part $T_2 = 200°$ C. with a vertical temperature gradient in the hot part of 3° C.

After a time of experiment of 2 weeks, a growth of 0.25; 0.13; 0.4 and 0.04 mm/day /face is recorded respectively for the orientations X, Y, Z and r.

EXAMPLE 4

A glass vessel, sealed under vacuum, of external diameter 30 mm and 250 mm is filled to 80% with a solution $H_2SO_4/AlPO_4$, respectively 5M and 2.5M, in which 8 flakes Y of berlinite are placed. These flakes are pierced and suspended by means of gold wires to a glass gibbet. The temperature at the start of crystallization of the solution previously determined from solubility curves of berlinite in $H_2SO_4$ is 175° C.

The vessel is brought as rapidly as possible to the temperature of crystallization initiation 175° C. and a slow rise in temperature of 1° C./day up to 200° C. and then of 2° C./day up to 220° C., is programmed.

After opening at the end of 35 days, a growth of the flakes Y of 0.14 mm/day/face is observed.

EXAMPLE 5

A platinum-jacketed autoclave (diameter: 40 mm, height: 300 mm) of 375 cm$^3$ in useful volume is used for the so-called vertical temperature gradient technique with a ratio cold part/hot part = 2/5.

In the cold portion are placed 50 g of aluminum phosphate in microcrystals of dimensions greater than 1.5 mm in the mother-body basket. In the hot part, 8 flakes of berlinite of various orientations (X, Y, Z and r) are suspended by means of gold wires to a platinum ladder. The autoclave is filled to 80% with a solution $H_2SO_4/AlPO_4$ respectively 6M and 2.2M.

The vessel is brought as rapidly as possible to the desired equilibrium temperatures: cold part $T_1$: 195° C., hot part $T_2$: 200° C.

At the end of a period of 3 weeks and after opening the autoclave, a growth of 0.22; 0.13, 0.4 and 0.04 mm/day/face is recorded for the orientations X, Y, Z and r.

EXAMPLE 6

The same vessel is used as for Example 3. In the cold part, are placed 50 g of aluminum phosphate in microcrystals in the mother-body basket. These microcrystals have dimensions comprised between 1 and 2 mm. In the hot part, 8 flakes of berlinite, of orientation Y, are suspended at the platinum ladder, by means of gold wire.

The autoclave is filled to 80% with a solution $H_2SO_4$, $H_3PO_4/AlPO_4$ respectively 6M, 6M and 2.5M then brought as rapidly as possible to the desired equilibrium temperatures. The temperature at the start of crystallization is previously determined by a "blank" test in which berlinite flakes are replaced by seeds of mediocre quality. It is, for the solution used, 195° C.

With a temperature gradient of 5° C. and at the end of a time of experiment of 3 weeks, an average growth of 0.08 mm/day/face for the plates of orientation Y is recorded.

EXAMPLE 7

Crystals produced as in Example 5 in solution $H_2SO_4$ 6.5M show the following characteristics: (Q=Q factor):

at $T_1 = 200°$ C. Q = 48 000 at 5 MHz in fundamental mode at $T_2 = 210°$ C. Q = 50 000 at 5 MHz in fundamental mode at $T_2 = 220°$ C. Q = 64 000 at 5 MHz in fundamental mode which can be compared with the factor for quartz of the order of 10$^6$.

These results demonstrate also the advantage of high temperatures for obtaining "dry crystals".

The following Table shows systematically the comparison of the berlinite according to the invention with quartz (resonator in thickness mode of Y plates rotated at the same frequency), on the hypothesis that the berlinite has values comparable with the constants C, E, EPS and CT of the first order but much weaker for the CTs of higher order.

| | |
|---|---|
| Coupling coefficient | increased by a factor 1.4–1.5 |
| Band widths of the | double |

| | | | |
|---|---|---|---|
| filters (AT cut) | | | |
| Angular sensitivity (C.T.F. 1° order) | reduced by a factor 1.5 | | |
| Heat stability (C.T.F. higher orders) | better | | |
| Q factors | already sufficient (comparable) | | |
| Thickness of the plates (AT) | reduced by a factor 1.13 | | |
| Dimension of the Electrodes (AT) | reduced by a factor 1.16 | | |

EXAMPLE 8

By operating as in Example 5, some crystals are grown in a solution of sulfuric acid 6M at a crystallization temperature $T^C$ of 210° C. with a temperature gradient of 6.4° C. The speed of growth measures are the following:

$V_Y = 0.030$ mm/day/face;
$V_X = 0.18$ mm/day/face;
$V_Z = 0.17$ mm/day/face;

first figure is significant. The water content of the same wafer was 50 ppm.

EXAMPLE 9

Crystals are made according to the process of Example 5 with a solution of sulfuric acid 6M at a temperature of crystallization of 230° C. The temperature gradient varied in order to obtain various speeds of growth. When the speed is comprised between about 0.05 and 0.20 mm/day/face, the water content is comprised between 20 and 100 ppm which entails a value of $Q \times \Gamma$ (Q is the surtension coefficient and $\Gamma$ the frequency) between $10^{13}$ and $1.5 \times 10^{12}$ in a partial 5 mode (the used frequency was 5 MHz).

EXAMPLE 10

Crystals were grown as in Example 5 in a solution $H_2SO_4$ 9M at a temperature of crystallization of 220° C. with various seed types. The relationship between the temperature gradient and the speed is summarized in the following Table:

| T° C. | $V_Y$ | $V_Z$ | $V_X$ (mm/day/face) |
|---|---|---|---|
| 4.5 | 0.0 | 0.007 | 0.11 |
| 7 | 0.05 | 0.12 | 0.22 |
| 10 | 0.06 | 0.14 | 0.24 |

In the last case ($\Delta T = 10°$ C.), the concentration in water is respectively 40, 80 and 180 ppm in the crystal made from respectively Y, Z and X seeds. The Q factors measured in partial 5 mode are respectively $10^6$, $5.10^5$ and $2.10^5$. All the crystals obtained in the example are of high purity. The crystal purity was determined in a mass spectrometer (Spark); only metallic impurities were detected, i.e. titanium, chromium, iron, copper and zinc; the total amount of these impurities was less than 10 ppm in atoms. About the Q factor measure, it was found that when the fundamental mode was used, the Q factor measure was limited by the apparatus itself. This is why, to obtain intrinsic values, higher mode measures were performed. These measures are not limited by the apparatus but gave values that are only sure at a factor 2. It shall be stressed that the values are underevaluated rather than overevaluated.

We claim:

1. Process for the preparation of crystals of berlinite $AlPO_4$ by a hydrothermal method, wherein the crystallization solution is an aqueous sulfuric solution of $AlPO_4$ and the crystallization temperature is in the range of about 190° C. to about 300° C.

2. The process of claim 1 wherein the crystals of berlinite $AlPO_4$ have a Q factor of at least 50,000 when measured at 5 MHz in the fundamental mode.

3. Process according to claim 1, wherein the crystallization solution is a solution of $AlPO_4$ in a mixture of $H_2SO_4$ and $H_3PO_4$.

4. Process according to claim 1, wherein the crystallization solution is a solution of $AlPO_4$ in $H_2SO_4$.

5. Process according to claim 1 wherein the crystallization solution and the mother-body are prepared by the action of $H_3PO_4$ on hydrated aluminum sulfate to obtain directly at the end of the reaction the mother-body in the crystallization solution.

6. Process according to claim 5 wherein the reaction is conducted in the presence of $H_2SO_4$.

7. Process according to claim 5, wherein the reaction is carried out in the crystallization vessel which will serve for the practicing of the hydrothermal method.

8. Process according to claim 1 wherein the crystallization vessel is filled to 80–85% of its volume by the crystallization solution.

9. Process according to claim 1 wherein the crystallization temperature is in the range of from about 200° C. to about 260° C.

* * * * *